US011016395B2

(12) United States Patent
Cao et al.

(10) Patent No.: US 11,016,395 B2
(45) Date of Patent: May 25, 2021

(54) METHODS OF DETERMINING SCATTERING OF RADIATION BY STRUCTURES OF FINITE THICKNESSES ON A PATTERNING DEVICE

(71) Applicant: ASML NETHERLANDS B.V., Veldhoven (NL)

(72) Inventors: Yu Cao, Saratoga, CA (US); Yen-Wen Lu, Saratoga, CA (US); Peng Liu, Cupertino, CA (US); Rafael C. Howell, Santa Clara, CA (US); Roshni Biswas, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/467,124

(22) PCT Filed: Dec. 6, 2017

(86) PCT No.: PCT/EP2017/081744
§ 371 (c)(1),
(2) Date: Jun. 6, 2019

(87) PCT Pub. No.: WO2018/121967
PCT Pub. Date: Jul. 5, 2018

(65) Prior Publication Data
US 2020/0073260 A1 Mar. 5, 2020

Related U.S. Application Data

(60) Provisional application No. 62/439,682, filed on Dec. 28, 2016.

(51) Int. Cl.
*G03F 7/20* (2006.01)
*G03F 1/36* (2012.01)

(52) U.S. Cl.
CPC .......... *G03F 7/705* (2013.01); *G03F 7/70283* (2013.01); *G03F 7/70866* (2013.01); *G03F 1/36* (2013.01)

(58) Field of Classification Search
CPC .................................................. G03F 7/705
See application file for complete search history.

(56) References Cited

U.S. PATENT DOCUMENTS 5,194,893 A    3/1993  Nishi
5,229,872 A    7/1993  Mumola
(Continued)

FOREIGN PATENT DOCUMENTS

TW    201539226    10/2015
YE    201037455    10/2010

OTHER PUBLICATIONS

International Search Report and Written Opinion issued in corresponding PCT Patent Application No. PCT/EP2017/081744, dated Feb. 19, 2018.
(Continued)

*Primary Examiner* — Michelle M Iacoletti
(74) *Attorney, Agent, or Firm* — Pillsbury Winthrop Shaw Pittman LLP

(57) ABSTRACT

A method including: obtaining a thin-mask transmission function of a patterning device and a M3D model for a lithographic process, wherein the thin-mask transmission function represents a continuous transmission mask and the M3D model at least represents a portion of M3D attributable to multiple edges of structures on the patterning device; determining a M3D mask transmission function of the patterning device by using the thin-mask transmission function and the M3D model; and determining an aerial image produced by the patterning device and the lithographic process, by using the M3D mask transmission function.

22 Claims, 12 Drawing Sheets

(56) References Cited

U.S. PATENT DOCUMENTS

| | | | |
|---|---|---|---|
| 5,296,891 | A | 3/1994 | Vogt et al. |
| 5,523,193 | A | 6/1996 | Nelson |
| 6,046,792 | A | 4/2000 | Van Der Werf et al. |
| 7,703,069 | B1 | 4/2010 | Liu et al. |
| 8,918,743 | B1 * | 12/2014 | Yan .......................... G03F 7/705 716/51 |
| 8,938,694 | B2 | 1/2015 | Liu et al. |
| 2009/0157360 | A1 | 6/2009 | Ye et al. |
| 2013/0179847 | A1 | 7/2013 | Hansen |
| 2015/0302132 | A1 | 10/2015 | Zhang et al. |
| 2017/0038692 | A1 | 2/2017 | Hsu et al. |

OTHER PUBLICATIONS

Taiwanese Office Action issued in corresponding Taiwanese Patent Application No. 106145450, dated Oct. 3, 2018.
Taiwanese Office Action issued in corresponding Taiwanese Patent Application No. 106145450, dated Mar. 5, 2019.
Nagahara, Seiji, et al.: "SMO for 28-nm logic device and beyond: Impact of source and mask complexity on lithography performance", Proc. of SPIE, vol. 7640, Jan. 1, 2010.

* cited by examiner

METHODS OF DETERMINING SCATTERING OF RADIATION BY STRUCTURES OF FINITE THICKNESSES ON A PATTERNING DEVICE

CROSS-REFERENCE TO RELATED APPLICATIONS

This application is the U.S. national phase entry of PCT Patent Application No. PCT/EP2017/081744, which was filed on Dec. 6, 2017, which claims the benefit of priority of U.S. provisional application No. 62/439,682, which was filed on Dec. 28, 2016, and which is incorporated herein in its entirety by reference.

TECHNICAL FIELD

The description herein relates generally to methods of determining scattering of radiation due to finite thicknesses of patterns on a patterning device for lithographic processes and lithographic projection apparatuses.

BACKGROUND

A lithographic projection apparatus can be used, for example, in the manufacture of integrated circuits (ICs). In such a case, a patterning device (e.g., a mask) may contain or provide a device pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the device pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, lithography is a central step in the manufacturing of device such as ICs, where patterns formed on substrates define functional elements of the devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC) in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

BRIEF SUMMARY

In an aspect, there is provided a method comprising: obtaining a thin-mask transmission function of a patterning device and a M3D model for a lithographic process; determining a M3D mask transmission function of the patterning device by using the thin-mask transmission function and the M3D model; and determining an aerial image produced by the patterning device and the lithographic process, by using the M3D mask transmission function; wherein the thin-mask transmission function is a continuous transmission mask (CTM); wherein the M3D model at least represents a portion of M3D effect attributable to multiple edges of structures on the patterning device.

According to an embodiment, the M3D model further represents a portion of M3D effect attributable to an edge where two sidewalls of a structure on the patterning device meet, or an edge where a sidewall of a structure on the patterning device and an area beyond a perimeter of the structure meet.

According to an embodiment, the M3D model further represents a portion of M3D effect attributable to areas along perimeters of structures on the patterning device.

According to an embodiment, the M3D model further represents a portion of M3D effect attributable to areas with variations of the thin-mask transmission function below a first threshold, or a portion of M3D effect attributable to areas with variations of the thin-mask transmission function above a second threshold.

According to an embodiment, the M3D model further represents a portion of M3D effect attributable to areas of the structures away from perimeters of structures on the patterning device.

According to an embodiment, the method further comprises determining a resist image using the aerial image.

According to an embodiment, determining the resist image comprises using a model of a resist used in the lithographic process.

According to an embodiment, the method further comprises determining the thin-mask transmission function from structures on the patterning device.

According to an embodiment, the method further comprises determining the structures from a design layout.

According to an embodiment, determining the aerial image comprises using a model of projection optics used in the lithographic process.

According to an embodiment, determining the aerial image comprises determining an electromagnetic field of a radiation after the radiation interacts with the patterning device by using the M3D mask transmission function and an electromagnetic field of the radiation before the radiation interacts with the patterning device.

According to an embodiment, the M3D mask transmission function comprises at least a first term and a second term that respectively characterize interactions of a radiation with a first area and a second area of the patterning device.

According to an embodiment, the M3D model comprises a plurality of kernel functions and determining the M3D mask transmission function comprises performing an integral transform of the thin-mask transmission function using the kernel functions.

According to an embodiment, the M3D model comprises a first kernel function and a second kernel function, and the first kernel function is linear and the second kernel function is multi-linear.

According to an embodiment, the second kernel function is bilinear.

According to an embodiment, the second kernel function is a quad-linear kernel function.

According to an embodiment, the second kernel function represents the portion of M3D effect attributable to multiple edges of structures on the patterning device.

According to an embodiment, the quad-linear kernel function represents a portion of M3D effect attributable to an edge where two sidewalls of a structure on the patterning device meet, or edges where a sidewall of a structure on the patterning device and an area beyond the perimeter of the structure meet.

According to an embodiment, the second kernel function represents a portion of M3D effect attributable to areas along perimeters of structures on the patterning device.

According to an embodiment, the first kernel function represents the portion of M3D effect attributable to areas with variations of the thin-mask transmission function below a first threshold, and the second kernel function represents the portion of M3D effect attributable to areas with variations of the thin-mask transmission function above a second threshold.

According to an embodiment, the first kernel function represents the portion of M3D effect attributable to areas of the structures away from perimeters of structures on the patterning device.

In an aspect, there is provided a computer program product comprising a non-transitory computer readable medium having instructions recorded thereon, the instructions when executed by a computer implementing any of the methods above.

DETAILED DESCRIPTION

Figure 1:
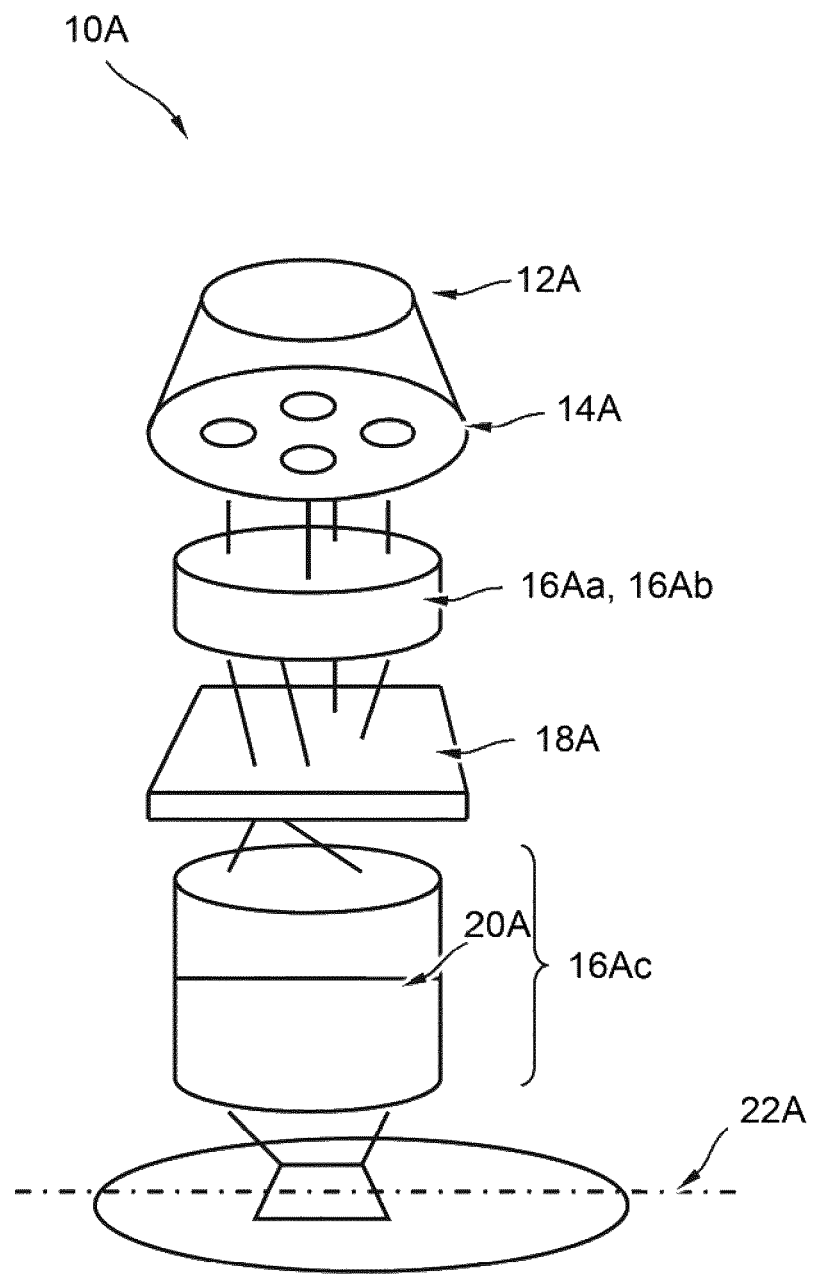
FIG. 1 shows a block diagram of various subsystems of a lithography system.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The patterning device can comprise, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. One or more of the design rule limitations may be referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

- a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.
- a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin ($\Theta_{max}$), n is the index of refraction of the media between the last element of projection optics and the substrate, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. US 2009-0157360, the disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it may be desirable to separate the optical properties of the patterning device from the optical properties of the rest of the lithographic projection apparatus including at least the source and the projection optics.

One aspect of understanding a lithographic process is understanding the interaction of the radiation and the patterning device. The electromagnetic field of the radiation after the radiation passes the patterning device may be determined from the electromagnetic field of the radiation before the radiation reaches the patterning device and a function that characterizes the interaction. This function may be referred to as the mask transmission function.

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance of the patterning device is a continuous function of the location on the patterning device. The phase of the transmittance may also be a continuous function of the location on the patterning device. A mask transmission function in the continuous form may be referred to as a continuous transmission mask (CTM).

The thin-mask approximation, also called the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device ("mask 3D" or "M3D") become smaller and smaller, the assumption of the thin-mask approximation can break down. For example, the interaction of radiation with the structures (e.g., edges between the top surface and a sidewall) because of their finite thicknesses ("mask 3D effect" or "M3D effect") may become significant. Encompassing this scattering in the mask transmission function may make the mask transmission function better at capturing the interaction of the radiation with the patterning device. A mask transmission function under the thin-mask approximation may be referred to as a thin-mask transmission function. A mask transmission function encompassing a M3D effect may be referred to as a M3D mask transmission function.

The M3D mask transmission function may be obtained by rigorous simulation such as a Finite-Discrete-Time-Domain (FDTD) algorithm or a Rigorous-Coupled Waveguide Analysis (RCWA) algorithm. However, rigorous simulation can be computationally expensive. Another approach is to rigorously simulate the M3D effect of certain portions of the structures that tend to have a large M3D effect, and add the M3D effect of these portions to a thin-mask transmission function. Although this approach is less computationally expensive, it still involves rigorous simulation.

In this disclosure, a method is disclosed that determines the M3D effect of structures on a patterning device from the thin-mask transmission function of the patterning device.

Figure 2:
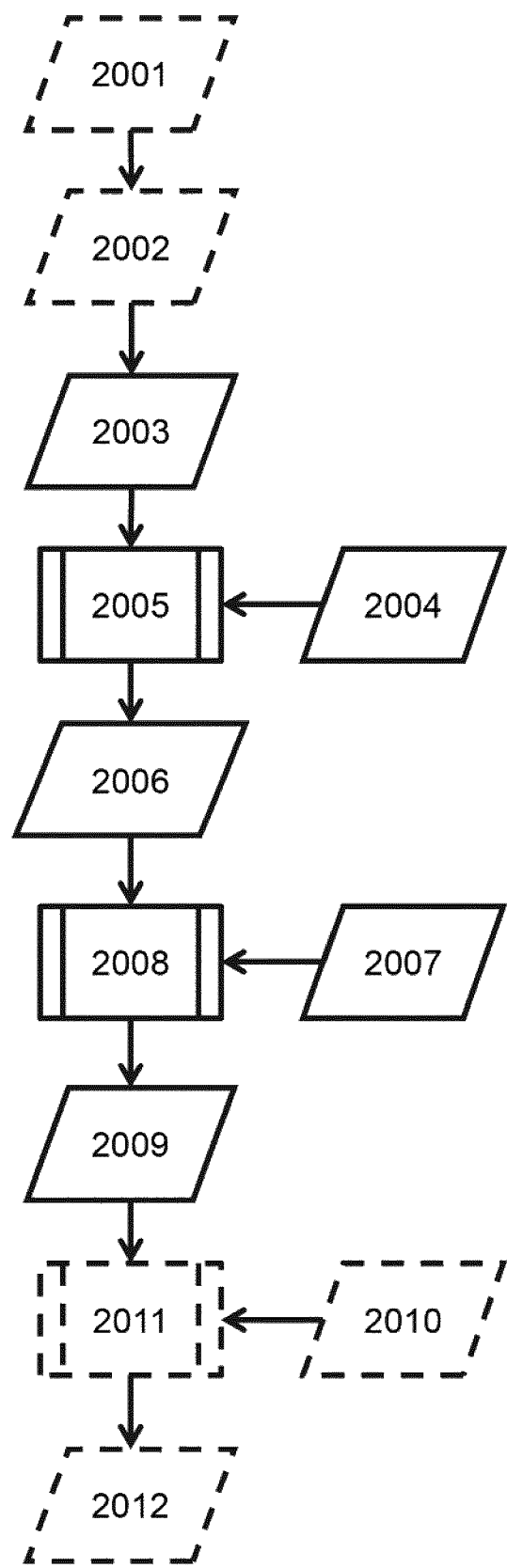
FIG. 2 shows a flowchart of a method for simulation of an aerial image or resist image where M3D is taken into account, according to an embodiment.

FIG. 2 is a flowchart of a method for determining an aerial image or resist image where M3D is taken into account, according to an embodiment. In procedure 2005, a thin-mask transmission function 2003 of a patterning device and a M3D model 2004 are used to determine a M3D mask transmission function 2006 of the patterning device. A M3D model is a model that models the M3D from a thin-mask transmission function. The thin-mask transmission function 2003 may be determined from structures 2002 on the patterning device. The structures 2002 may be determined from a design layout 2001. In procedure 2008, the M3D mask transmission function 2006 and a projection optics model 2007 are used to determine (e.g., simulate) an aerial image 2009. The aerial image 2009 and a resist model 2010 may be used in optional procedure 2011 to determine (e.g., simulate) a resist image 2012.

Figure 3:
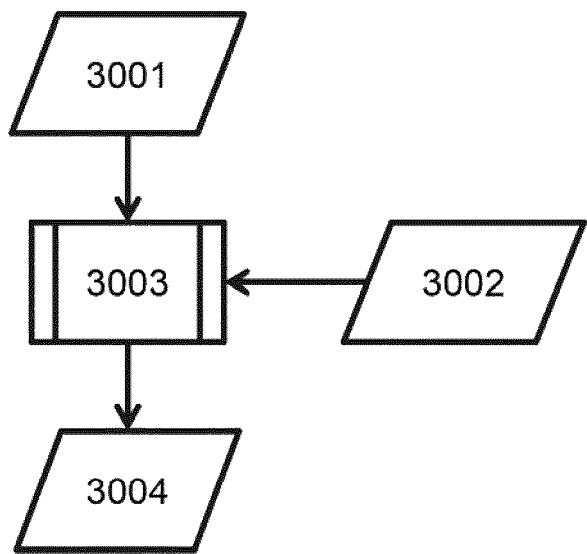
FIG. 3 schematically shows a flow chart for using the mask transmission function.

The mask transmission function (e.g., thin-mask or M3D) of a patterning device is a function that links the electromagnetic field of the radiation before it interacts with the patterning device and the electromagnetic field of the radiation after it interacts with the patterning device. FIG. 3 schematically shows a flow chart for using the mask transmission function. The electromagnetic field 3001 of the radiation before it interacts with the patterning device and the mask transmission function 3002 are used in procedure 3003 to determine the electromagnetic field 3004 of the radiation after it interacts with the patterning device. The mask transmission function 3002 may be a thin-mask transmission function. The mask transmission function 3002 may be a M3D mask transmission function. In a generic mathematical form, the relationship between the electromagnetic field 3001 and the electromagnetic field 3004 may be expressed as $E_a(r)=T(E_b(r))$, wherein $E_a(r)$ is the electric component of the electromagnetic field 3004, $E_b(r)$ is the electric component of the electromagnetic field 3001, and T is the mask transmission function.

Figure 4:
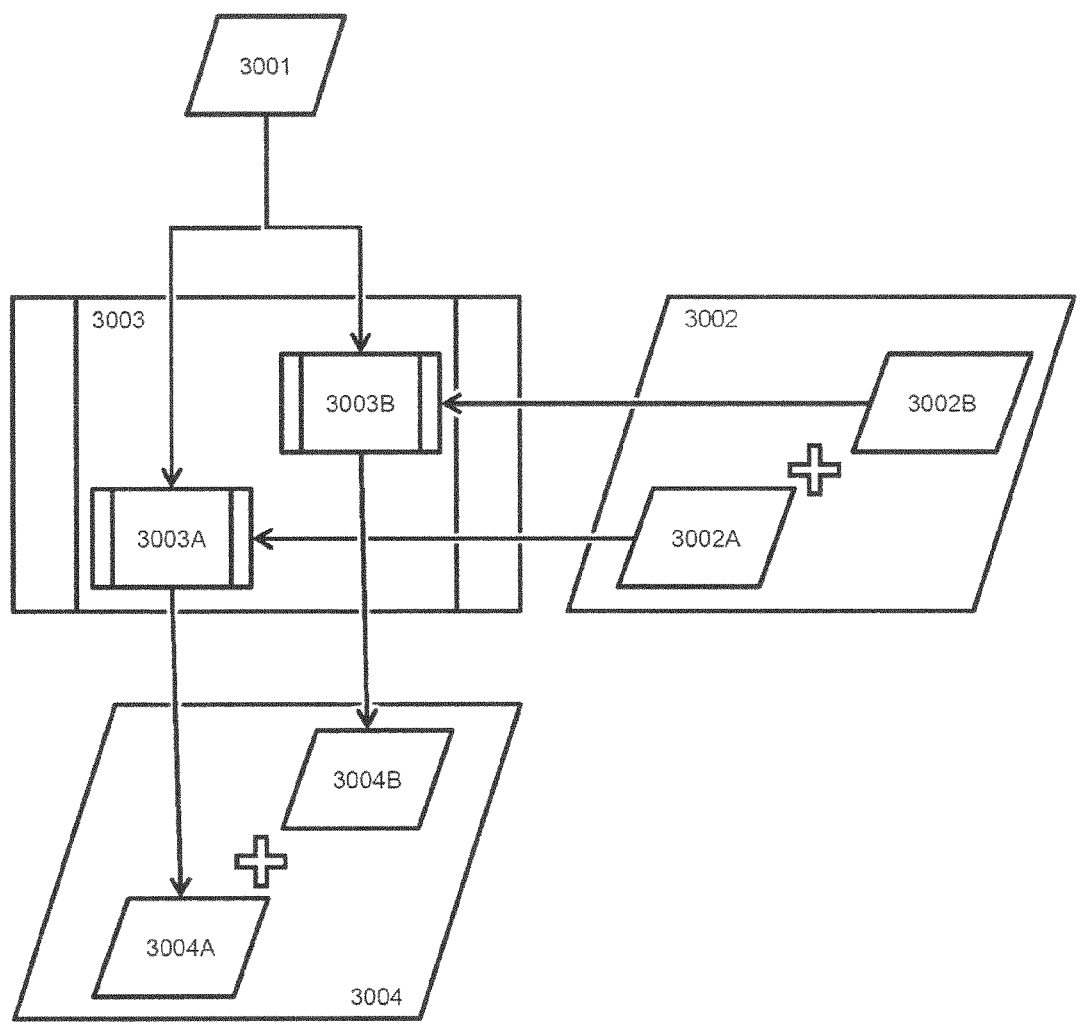
FIG. 4 schematically shows a special case of the flow chart of FIG. 3.

FIG. 4 schematically shows the flow of FIG. 3 where the mask transmission function 3002 is a M3D mask transmission function and is a sum of at least two terms 3002A and 3002B, where the terms 3002A and 3002B respectively characterize the interactions of the radiation with different areas of the patterning device. The electromagnetic field 3001 and the term 3002A are used in a sub-procedure 3003A of the procedure 3003 to determine a portion 3004A of the electromagnetic field 3004, where the portion 3004A is a result of the interaction of the radiation (as represented by the electromagnetic field 3001) with a first area of the patterning device. The electromagnetic field 3001 and the term 3002B are used in a sub-procedure 3003B of the procedure 3003 to determine a portion 3004B of the electromagnetic field 3004, where the portion 3004B is a result of the interaction of the radiation (as represented by the electromagnetic field 3001) with a second area of the patterning device. The electromagnetic field 3004 may be approximated by the sum of the portions 3004A and 3004B.

The M3D model 2004 in FIG. 2 may include one or more kernel functions. The procedure 2005 in FIG. 2 may include performing an integral transform of the thin-mask transmission function 2003 using the one or more kernel functions.

According to an embodiment, the kernel functions may include a linear kernel function and a multi-linear (e.g., bilinear) kernel function. The linear kernel function may represent a portion of the M3D effect attributable to areas of relatively small variations of the thin-mask transmission function. For example, when the thin-mask transmission function is a binary transmission function, the areas of small variations may include flat areas (i.e., away from areas with thickness changes) of the structures on the patterning device. When the thin-mask transmission function is a CTM, the areas of small variations may include areas where derivatives of the phase and modulus with respect to positions are below a threshold. The multi-linear kernel function may represent portions of the M3D effect attributable to areas of relatively large variations of the thin-mask transmission function. For example, when the thin-mask transmission function is a binary transmission function, the areas of large variations may include areas near edges and corners (i.e., near changes of the thickness) of the structures on the patterning device. When the thin-mask transmission function is a CTM, the areas of large variations may include areas where derivatives of the phase and modulus with respect to positions are above a threshold. The multi-linear kernel function may represent portions of the M3D effect attributable to areas that contain two or more large variations of the transmission function, for example, areas including two edges close to each other.

Figure 5:
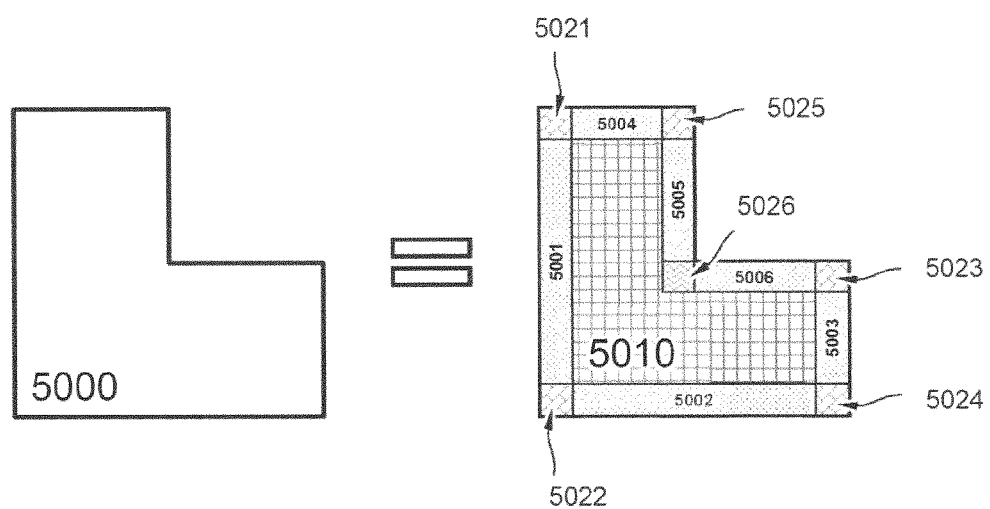
FIG. 5 schematically shows a pattern on the patterning device, as an example to show the areas of small variations of the transmission function and the areas of large variations of the transmission function.

FIG. 5 schematically shows a pattern 5000 on the patterning device, as an example to show areas of relatively small variations of the transmission function and areas of relatively large variations of the transmission function. The pattern 5000 has a finite thickness. The pattern 5000 is defined by sidewalls along its perimeter, where, within the perimeter, the thickness is a finite positive constant and the thickness is zero beyond the perimeter. Areas of relatively small variations would include the area 5010 in the interior of the pattern 5000, away from the perimeter. The portion of M3D effect attributable to the area 5010 may be represented by a linear kernel function. Areas of relatively large variations would include the areas 5001-5006 along edges of the perimeter and away from corners, and the areas 5021-5026 near the corners. The portion of M3D effect attributable of these areas 5001-5006 and 5021-5026 may be represented by the multi-linear kernel function.

In an example, the M3D mask transmission function may be derived from the thin-mask transmission function using the following formula:

$$\int m(r_1)m^*(r_2)T(r-r_1,r-r_2)dr_1 dr_2 + \int m(r_1)R(r-r_1)dr_1$$

wherein m(r) is the thin-mask transmission function, T is a bilinear kernel function as an example of the multi-linear kernel function, and R is a linear kernel function.

In another example, the M3D mask transmission function may be derived from the thin-mask transmission function using the following formula:

$$\{\int [\int m(r_1)F(r_2-r_1)dr_1]^2 G(r-r_2)dr_2\} + \int m(r_1)R(r-r_1)dr_1$$

Namely, the multi-linear kernel may be approximated by a kernel function F that detects edges and a kernel function G that derives the M3D effect of the edges. In this approximation, the M3D effect attributable to areas that contain two or more large variations of the transmission function (e.g., areas including two edges close to each other) are ignored.

The multi-linear kernel function may include kernel functions of higher orders than bilinear kernel functions. For example, the kernel functions may include a quad-linear kernel function, which may represent portions of the M3D effect attributable to edges where two sidewalls meet, or edges where a sidewall and an area beyond the perimeter of a structure meet.

The M3D model (e.g., as represented by the kernel functions) may vary with the lithographic process (e.g., as represented by one or more characteristics of the radiation and one or more characteristics of the patterning device). The M3D model may be derived for a particular lithographic process. The M3D model (e.g., as represented by the kernel functions) may be obtained by simulation.

Figure 6A:
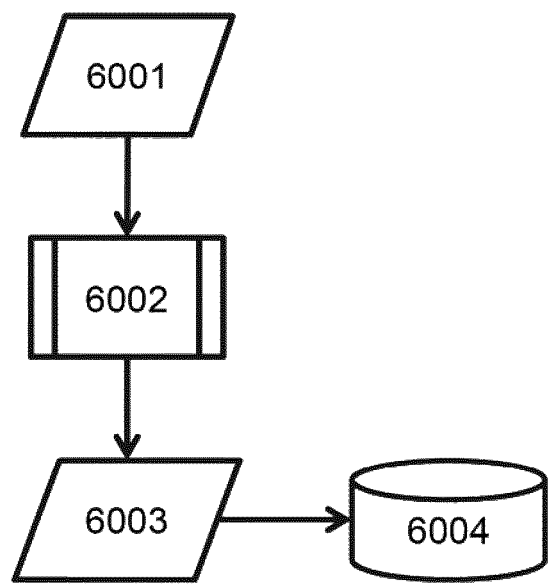
FIG. 6A schematically shows a flow chart where M3D models may be derived for a number of lithographic processes and stored in a database for future use.

FIG. 6A schematically shows a flow chart where M3D models may be derived for a number of lithographic processes and stored in a database for future use. One or more characteristics of a lithographic process 6001 are used to derive a M3D model 6003 for the lithographic process 6001 in procedure 6002. The M3D model 6003 may be obtained by simulation. The M3D model 6003 is stored in a database 6004.

Figure 6B:
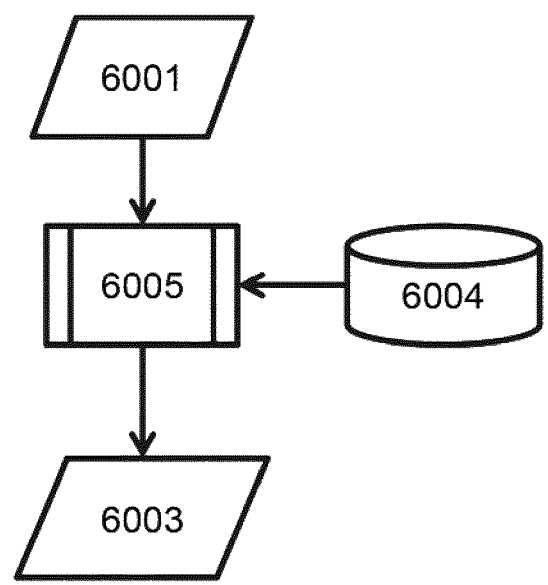
FIG. 6B schematically shows a flow chart where a M3D model may be retrieved from a database based on the lithographic process.

FIG. 6B schematically shows a flow chart where a M3D model may be retrieved from a database based on the lithographic process. In procedure 6005, one or more characteristics of a lithographic process 6001 are used to query the database 6004 and retrieve a M3D model 6003 for the lithographic process 6001.

Figure 7:
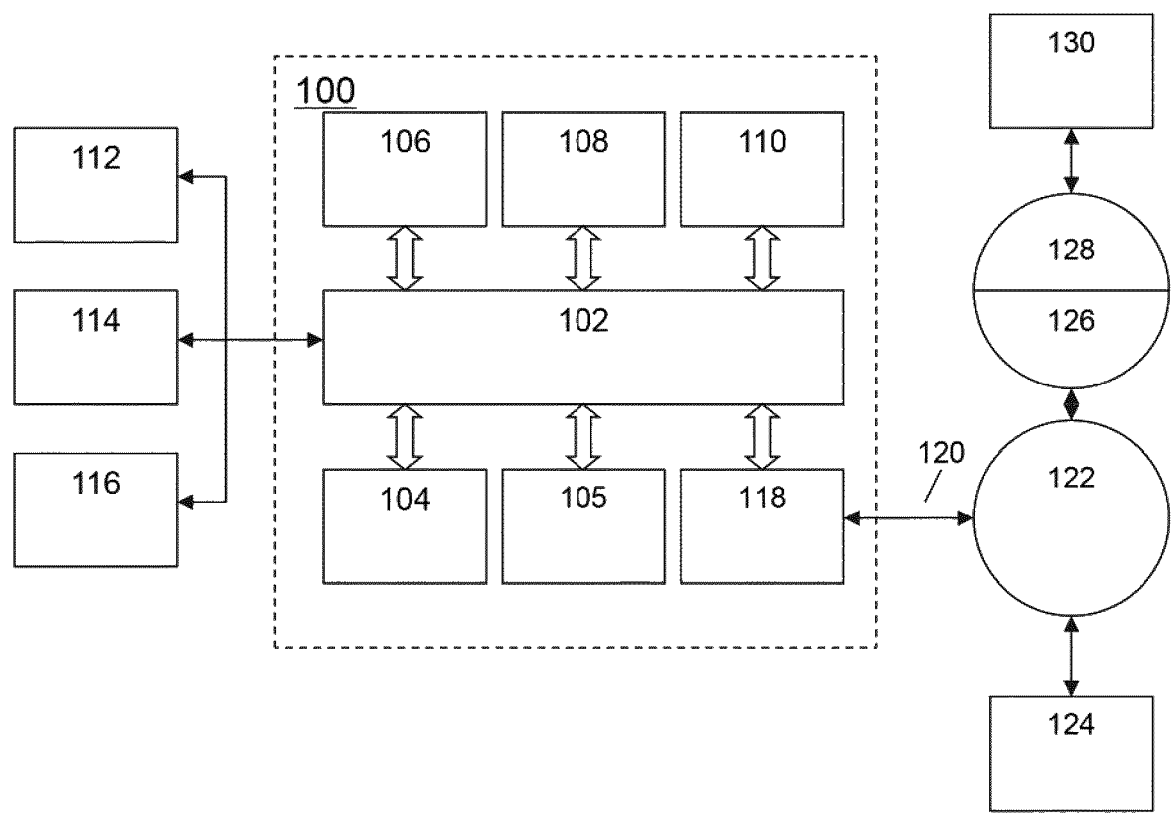
FIG. 7 is a block diagram of an example computer system.

FIG. 7 is a block diagram that illustrates a computer system 100 which can assist in implementing the methods, flows or the apparatus disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform one or more of the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for one or more process steps described herein, for example. The received code may be executed by processor 104 as it is received, and/or stored in storage device 110, or other non-volatile storage for later execution. In this manner, computer system 100 may obtain application code in the form of a carrier wave.

Figure 8:
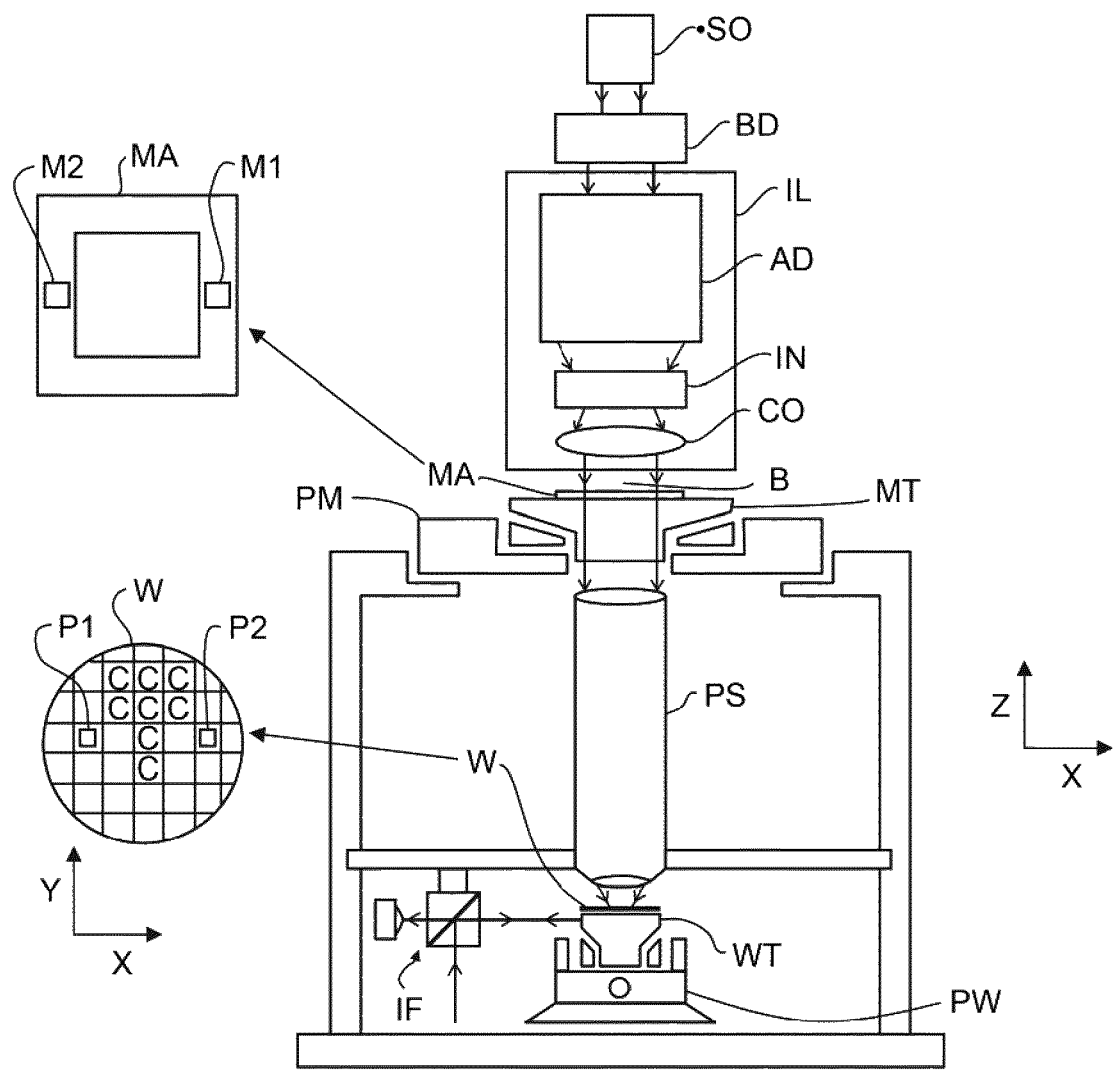
FIG. 8 is a schematic diagram of a lithographic projection apparatus.

FIG. 8 schematically depicts an exemplary lithographic projection apparatus whose illumination could be optimized utilizing the methods described herein. The apparatus comprises:

an illumination system IL, to condition a beam B of radiation. In this particular case, the illumination system also comprises a radiation source SO;

a first object table (e.g., patterning device table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist-coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as G-outer and G-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 8 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 8. However, in the case of a stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 9:
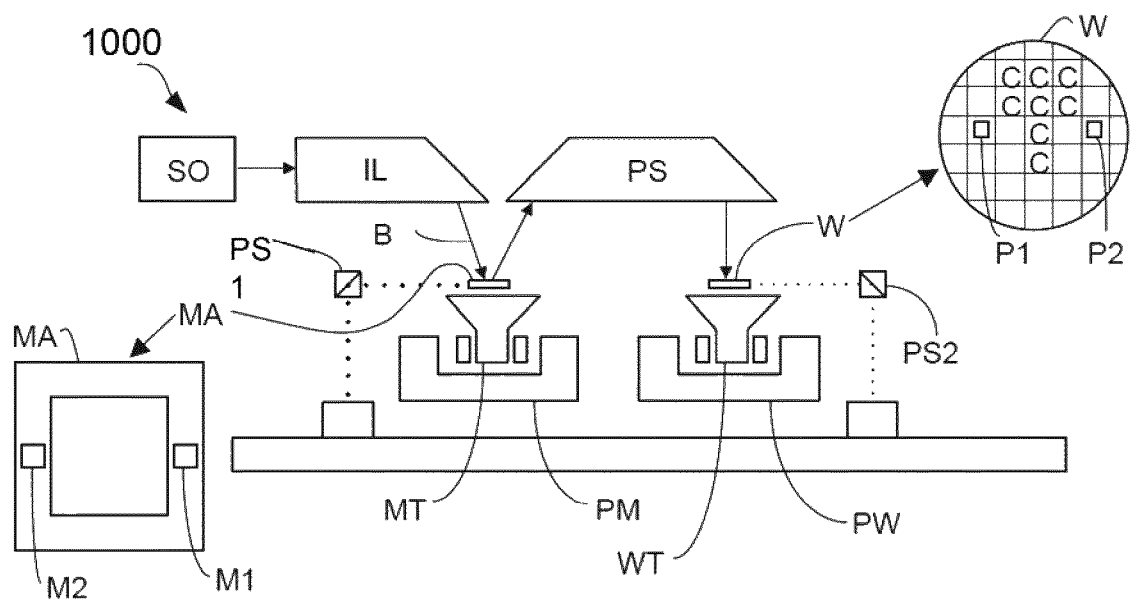
FIG. 9 is a schematic diagram of another lithographic projection apparatus.

FIG. 9 schematically depicts another exemplary lithographic projection apparatus 1000 whose illumination could be optimized utilizing the methods described herein.

The lithographic projection apparatus 1000 comprises:

a source collector module SO an illumination system (illuminator) IL configured to condition a radiation beam B (e.g. EUV radiation).

a support structure (e.g. a patterning device table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 9, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 9, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.

3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 10:
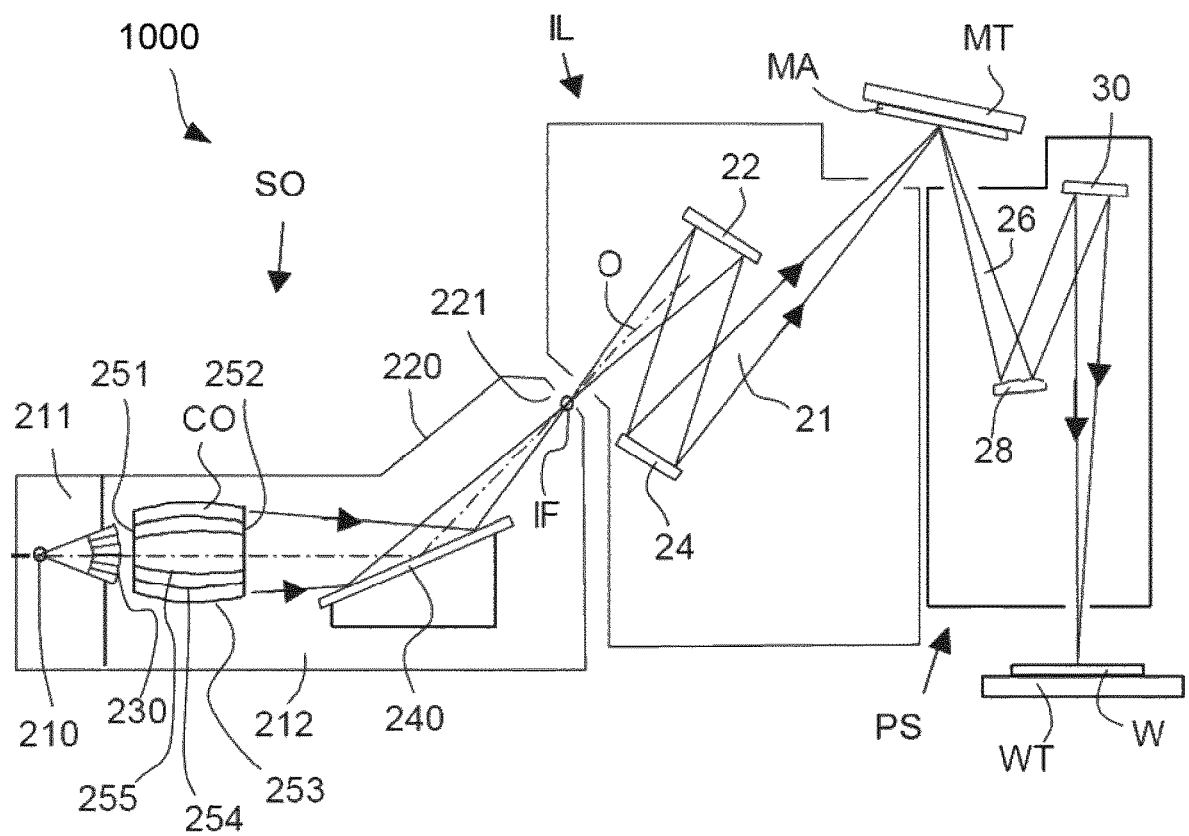
FIG. 10 is a more detailed view of the apparatus in FIG. 9.

FIG. 10 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 10.

Collector optic CO, as illustrated in FIG. 10, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 11:
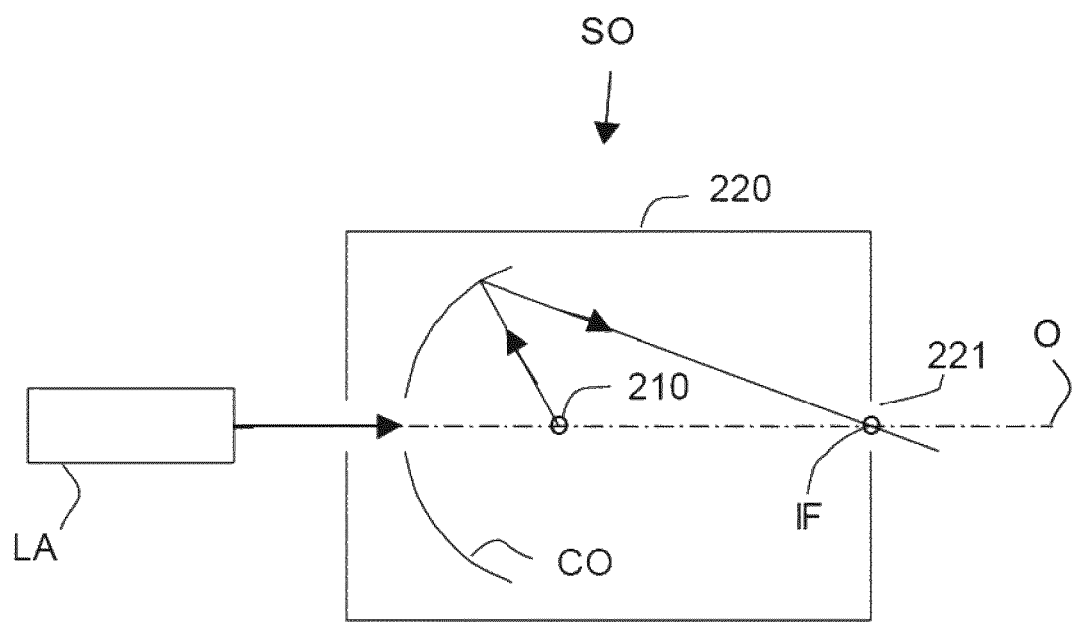
FIG. 11 is a more detailed view of the source collector module SO of the apparatus of FIG. 9 and FIG. 10.

Alternatively, the source collector module SO may be part of an LPP radiation system as shown in FIG. 11. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220. U.S. Patent Application Publication No. US 2013-0179847 is hereby incorporated by reference in its entirety.

The embodiments may further be described using the following clauses:

1. A method comprising:
obtaining a thin-mask transmission function of a patterning device and a M3D model for a lithographic process, wherein the thin-mask transmission function is a continuous transmission mask and the M3D model at least represents a portion of M3D effect attributable to multiple edges of a structure on the patterning device;
determining a M3D mask transmission function of the patterning device by using the thin-mask transmission function and the M3D model; and
determining an aerial image produced by the patterning device and the lithographic process, by using the M3D mask transmission function.

2. The method of clause 1, wherein the M3D model further represents a portion of M3D effect attributable to an edge where two sidewalls of a structure on the patterning device meet, or attributable to an edge where a sidewall of a structure on the patterning device and an area beyond a perimeter of the structure meet.

3. The method of clause 1 or clause 2, wherein the M3D model further represents a portion of M3D effect attributable to an area along a perimeter of a structure on the patterning device.

4. The method of any of clauses 1-3, wherein the M3D model further represents a portion of M3D effect attributable to an areas with a variation of the thin-mask transmission function below a first threshold, or a portion of M3D effect attributable to an area with a variation of the thin-mask transmission function above a second threshold.

5. The method of any of clauses 1-4, wherein the M3D model further represents a portion of M3D effect attributable to an area of a structure away from a perimeter of the structure on the patterning device.

6. The method of any of clauses 1-5, further comprising determining a resist image using the aerial image.

7. The method of clause 6, wherein determining the resist image comprises using a model of a resist used in the lithographic process.

8. The method of any of clauses 1-7, further comprising determining the thin-mask transmission function from structures on the patterning device.

9. The method of clause 8, further comprising determining the structures from a design layout.

10. The method of any of clauses 1-9, wherein determining the aerial image comprises using a model of projection optics used in the lithographic process.

11. The method of any of clauses 1-10, wherein determining the aerial image comprises determining an electromagnetic field of radiation after the radiation interacts with the patterning device by using the M3D mask transmission function and an electromagnetic field of the radiation before the radiation interacts with the patterning device.

12. The method of any of clauses 1-11, wherein the M3D mask transmission function comprises at least a first term and a second term that respectively characterize interactions of a radiation with a first area and a second area of the patterning device.

13. The method of any of clauses 1-12, wherein the M3D model comprises a plurality of kernel functions and determining the M3D mask transmission function comprises performing an integral transform of the thin-mask transmission function using the kernel functions.

14. The method of any of clauses 1-13, wherein the M3D model comprises a first kernel function and a second kernel function, wherein the first kernel function is linear and the second kernel function is multi-linear.

15. The method of clause 14, wherein the second kernel function is bilinear.

16. The method of clause 14, wherein the second kernel function is a quad-linear kernel function.

17. The method of clause 16, wherein the quad-linear kernel function represents a portion of M3D effect attributable to an edge where two sidewalls of a structure on the patterning device meet, or attributable to an edge where a sidewall of a structure on the patterning device and an area beyond the perimeter of the structure meet.

18. The method of any of clauses 14-17, wherein the second kernel function represents the portion of M3D effect attributable to multiple edges of structures on the patterning device.

19. The method of any of clauses 14-18, wherein the second kernel function represents a portion of M3D effect attributable to an area along a perimeter of a structure on the patterning device.

20. The method of any of clauses 14-19, wherein the first kernel function represents the portion of M3D effect attributable to an area with a variation of the thin-mask transmission function below a first threshold, and the second kernel function represents the portion of M3D effect attributable to an area with a variation of the thin-mask transmission function above a second threshold.

21. The method of any of clauses 14-20, wherein the first kernel function represents the portion of M3D effect attributable to an area of a structure away from a perimeter of the structure on the patterning device.

22. A computer program product comprising a non-transitory computer readable medium having instructions recorded thereon, the instructions when executed by a computer implementing a method of any of clauses 1-21.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method comprising:
    obtaining a thin-mask transmission function of a patterning device and a M3D model for a lithographic process, wherein the M3D model at least represents a portion of M3D effect attributable to multiple edges of a structure on the patterning device;
    determining, by a hardware computer, a M3D mask transmission function of the patterning device by using the thin-mask transmission function and the M3D model, the M3D mask transmission function comprising a term having a variable; and
    determining an aerial image produced by the patterning device and the lithographic process, by using the M3D mask transmission function.

2. The method of claim 1, wherein the M3D mask transmission function comprises at least a first term and a second term that respectively characterize interactions of a radiation with a first area and a second area of the patterning device.

3. The method of claim 1, wherein the M3D model comprises a plurality of kernel functions and determining the M3D mask transmission function comprises performing an integral transform of the thin-mask transmission function using the kernel functions.

4. The method of claim 1, wherein the M3D model comprises a first kernel function and a second kernel function, wherein the first kernel function is linear and the second kernel function is multi-linear.

5. The method of claim 4, wherein the second kernel function is bilinear or a quad-linear kernel function.

6. The method of claim 4, wherein the second kernel function represents the portion of M3D effect attributable to multiple edges of structures on the patterning device.

7. The method of claim 4, wherein the second kernel function represents a portion of M3D effect attributable to an area along a perimeter of a structure on the patterning device.

8. The method of claim 4, wherein the first kernel function represents the portion of M3D effect attributable to an area with a variation of the thin-mask transmission function below a first threshold, and the second kernel function represents the portion of M3D effect attributable to an area with a variation of the thin-mask transmission function above a second threshold.

9. The method of claim 4, wherein the first kernel function represents the portion of M3D effect attributable to an area of a structure away from a perimeter of the structure on the patterning device.

10. The method of claim 1, wherein the thin-mask transmission function represents a continuous transmission mask.

11. A computer program product comprising a non-transitory computer readable medium having instructions therein, the instructions, upon execution by a computer system, configured to cause the computer system to at least:
    obtain a thin-mask transmission function of a patterning device and a M3D model for a lithographic process, wherein the M3D model at least represents a portion of M3D effect attributable to multiple edges of a structure on the patterning device;
    determine a M3D mask transmission function of the patterning device by using the thin-mask transmission function and the M3D model, the M3D mask transmission function comprising a term having a variable; and
    determine an aerial image produced by the patterning device and the lithographic process, by using the M3D mask transmission function.

12. The computer program product of claim 11, wherein the M3D model further represents a portion of M3D effect attributable to an edge where two sidewalls of a structure on the patterning device meet, or attributable to an edge where a sidewall of a structure on the patterning device and an area beyond a perimeter of the structure meet.

13. The computer program product of claim 11, wherein the instructions are further configured to determine the thin-mask transmission function from structures on the patterning device.

14. The computer program product of claim 11, wherein the M3D mask transmission function comprises at least a first term and a second term that respectively characterize interactions of a radiation with a first area and a second area of the patterning device.

15. The computer program product of claim 11, wherein the M3D model comprises a plurality of kernel functions and wherein the instructions configured to cause the computer system to determine the M3D mask transmission function are further configured to perform an integral transform of the thin-mask transmission function using the kernel functions.

16. The computer program product of claim 11, wherein the M3D model comprises a first kernel function and a second kernel function, wherein the first kernel function is linear and the second kernel function is multi-linear.

17. The computer program product of claim 16, wherein the second kernel function is bilinear or a quad-linear kernel function.

18. The computer program product of claim 16, wherein the second kernel function represents a portion of M3D effect attributable to multiple edges of structures on the patterning device.

19. The computer program product of claim 16, wherein the second kernel function represents a portion of M3D effect attributable to an area along a perimeter of a structure on the patterning device.

20. The computer program product of claim 16, wherein the first kernel function represents a portion of M3D effect attributable to an area with a variation of the thin-mask transmission function below a first threshold, and the second kernel function represents a portion of M3D effect attributable to an area with a variation of the thin-mask transmission function above a second threshold.

21. The computer program product of claim 16, wherein the first kernel function represents a portion of M3D effect attributable to an area of a structure away from a perimeter of the structure on the patterning device.

22. The computer program product of claim 11, wherein the thin-mask transmission function represents a continuous transmission mask.

\* \* \* \* \*